US009620422B2

(12) United States Patent
Colinge et al.

(10) Patent No.: US 9,620,422 B2
(45) Date of Patent: Apr. 11, 2017

(54) SEMICONDUCTOR ARRANGEMENT

(71) Applicant: Taiwan Semiconductor Manufacturing Company Limited, Hsin-Chu (TW)

(72) Inventors: Jean-Pierre Colinge, Hsinchu (TW); Chung-Cheng Wu, Ju-Bei (TW); Sang Hoo Dhong, Hsinchu (TW); Ta-Pen Guo, Taipei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 15/160,206

(22) Filed: May 20, 2016

(65) Prior Publication Data
US 2016/0268168 A1 Sep. 15, 2016

Related U.S. Application Data

(60) Division of application No. 14/289,766, filed on May 29, 2014, now Pat. No. 9,356,020, which is a
(Continued)

(51) Int. Cl.
H01L 21/8238 (2006.01)
H01L 27/092 (2006.01)
(Continued)

(52) U.S. Cl.
CPC ........ H01L 21/82385 (2013.01); B82Y 10/00 (2013.01); B82Y 40/00 (2013.01);
(Continued)

(58) Field of Classification Search
None
See application file for complete search history.

(56) References Cited

U.S. PATENT DOCUMENTS

| 2008/0128797 A1* | 6/2008 | Dyer | H01L 29/785 |
| | | | 257/328 |
| 2011/0068418 A1 | 3/2011 | Lung | |

(Continued)

FOREIGN PATENT DOCUMENTS

| CN | 102832221 A | 12/2012 |
| TW | 201306178 | 2/2013 |
| WO | 2012101107 A1 | 8/2012 |

OTHER PUBLICATIONS

A new vertical MOSFET "Vertical Logic Circuit (VLC) MOSFET" suppressing asymmetric characteristics and realizing an ultra compact and robust logic circuit, Solid-State Electronics, Koji Sakui, 2010.

(Continued)

Primary Examiner — Khaja Ahmad
(74) Attorney, Agent, or Firm — Cooper Legal Group, LLC

(57) ABSTRACT

A semiconductor arrangement includes a first semiconductor device including a first type region having a first conductivity type and a second type region having a second conductivity type. The semiconductor arrangement includes a second semiconductor device adjacent the first semiconductor device. The second semiconductor device includes a third type region having a third conductivity type and a fourth type region having a fourth conductivity type. The semiconductor arrangement includes a first insulator layer including a first insulator portion around at least some of the first semiconductor device and a second insulator portion around at least some of the second semiconductor device. The first insulator portion has a first insulator height, and the second insulator portion has a second insulator height. The
(Continued)

first insulator height is different than the second insulator height. A method of forming a semiconductor arrangement is provided.

20 Claims, 13 Drawing Sheets

Related U.S. Application Data continuation-in-part of application No. 14/025,041, filed on Sep. 12, 2013.

(51) Int. Cl.
| | |
|---|---|
| H01L 29/06 | (2006.01) |
| H01L 29/423 | (2006.01) |
| H01L 29/786 | (2006.01) |
| H01L 29/78 | (2006.01) |
| H01L 27/088 | (2006.01) |
| H01L 29/66 | (2006.01) |
| B82Y 10/00 | (2011.01) |
| B82Y 40/00 | (2011.01) |
| H01L 29/775 | (2006.01) |
| H01L 21/8234 | (2006.01) |

(52) U.S. Cl.
CPC ........... *H01L 21/823456* (2013.01); *H01L 21/823487* (2013.01); *H01L 21/823807* (2013.01); *H01L 21/823885* (2013.01); *H01L 27/088* (2013.01); *H01L 27/092* (2013.01); *H01L 29/0676* (2013.01); *H01L 29/42392* (2013.01); *H01L 29/66439* (2013.01); *H01L 29/66666* (2013.01); *H01L 29/775* (2013.01); *H01L 29/7827* (2013.01); *H01L 29/78642* (2013.01); *H01L 29/78696* (2013.01)

(56) References Cited

U.S. PATENT DOCUMENTS

| | | |
|---|---|---|
| 2011/0079852 A1 | 4/2011 | Lander |
| 2011/0147848 A1* | 6/2011 | Kuhn ............... H01L 21/76229 257/368 |
| 2012/0012948 A1 | 1/2012 | Yeh et al. |
| 2012/0319201 A1 | 12/2012 | Sun et al. |
| 2013/0095644 A1 | 4/2013 | Tu et al. |
| 2013/0161762 A1 | 6/2013 | Kelly et al. |
| 2014/0225184 A1 | 8/2014 | Colinge et al. |
| 2015/0048441 A1 | 2/2015 | Colinge et al. |
| 2015/0076596 A1 | 3/2015 | Colinge et al. |

OTHER PUBLICATIONS

Enhanced Electrostatic Integrity of Short-Channel Junctionless Transistor With High-k Spacers, IEEE Electron Device Letters, vol. 32, No. 10, Suresh Gundapaneni et al., Oct. 2011, pp. 1325-1327.
Performance estimation of junctionless multigate transistors, Solid-State Electronics, Chi-Woo Lee, 2009.
Lee, et al., "Short-Channel Junctionless Nanowire Transistors", pp. 2, 2010, http://www.nanofunction.eu/data/document/latenews.pdf.
Corresponding Taiwanese application, Taiwanese Office action dated Feb. 15, 2016, 6 pages.
Corresponding Taiwan Application 10521397860, Taiwan Office action dated Nov. 14, 2016, 5 pages.
Corresponding Chinese Application 201410300267.2, Chinese Office action dated Dec. 28, 2016, 5 pages.

* cited by examiner

SEMICONDUCTOR ARRANGEMENT

RELATED APPLICATION(S)

This application is a divisional of U.S. patent application Ser. No. 14/289,766, titled "SEMICONDUCTOR ARRANGEMENT" and filed on May 29, 2014, which is continuation in-part of U.S. patent application Ser. No. 14/025,041, titled "SEMICONDUCTOR DEVICE WITH REDUCED ELECTRICAL RESISTANCE AND CAPACITANCE" and filed on Sep. 12, 2013. U.S. patent application Ser. No. 14/289,766 and U.S. patent application Ser. No. 14/025,041 are incorporated herein by reference.

BACKGROUND

In a semiconductor device, current flows through a channel region between a source region and a drain region upon application of a sufficient voltage or bias to a gate of the device. When current flows through the channel region, the device is generally regarded as being in an 'on' state, and when current is not flowing through the channel region, the device is generally regarded as being in an 'off' state.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, dimensions of the various features may be arbitrarily increased or reduced for clarity of discussion.

DETAILED DESCRIPTION

Figure 1A:
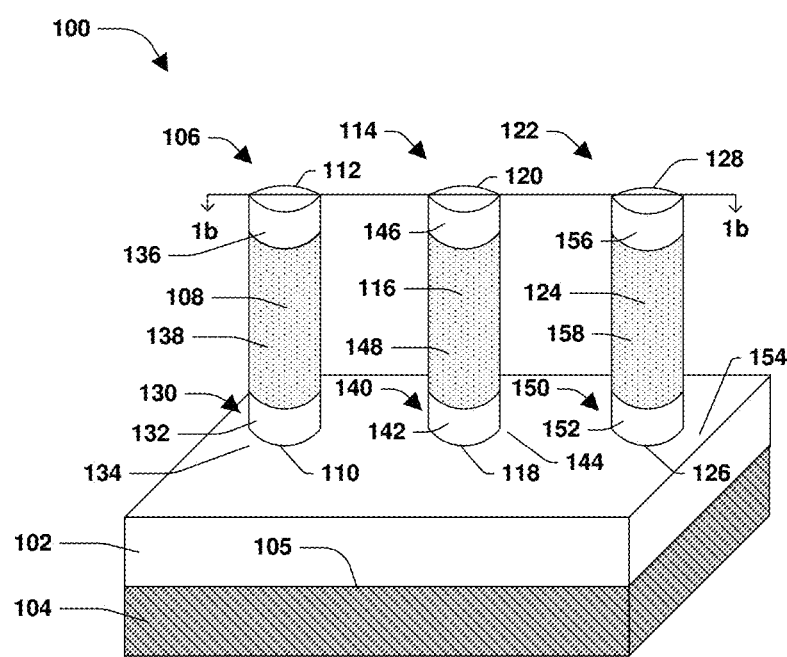
FIG. 1a illustrates a portion of a semiconductor arrangement, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor arrangement and resulting structures formed thereby are provided herein. Some embodiments of the present disclosure have one or a combination of the following features and/or advantages.

Figure 1B:
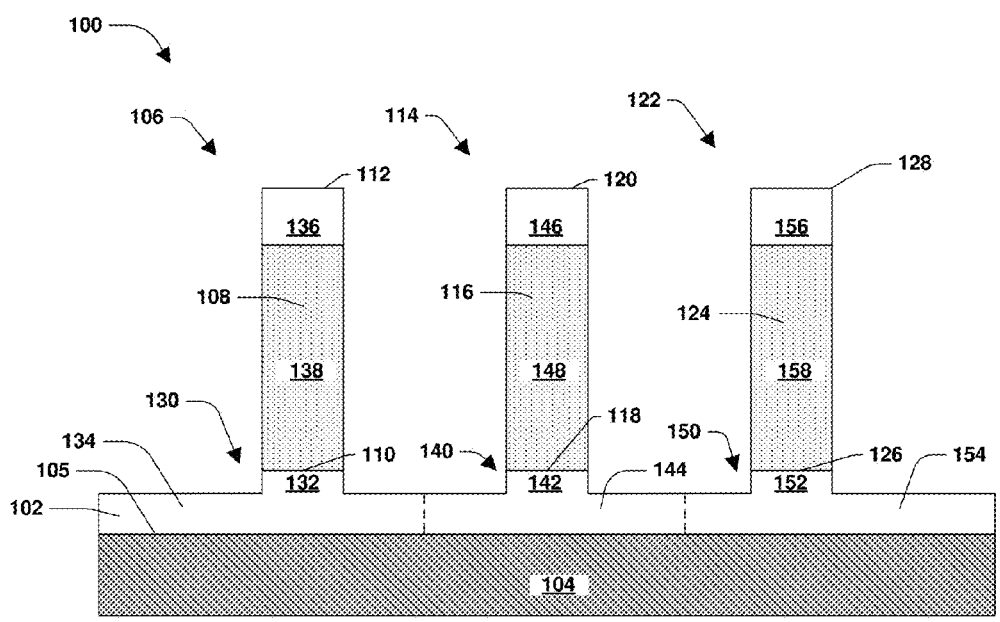
FIG. 1b illustrates a portion of a semiconductor arrangement, in accordance with some embodiments.

With reference initially to FIG. 1a and FIG. 1b, a perspective view of a portion of a semiconductor arrangement 100, according to some embodiments, is illustrated in FIG. 1a, and a cross sectional view of the portion of the semiconductor arrangement 100, according to some embodiments, is illustrated in FIG. 1b. In some embodiments, the semiconductor arrangement 100 is formed upon a doped region 102. In some embodiments, the doped region 102 comprises a p-type diffusion or doping. In some embodiments, the doped region 102 comprises an n-type diffusion or doping.

According to some embodiments, the doped region 102 is formed on or within a substrate 104. The substrate 104 comprises any number of materials, such as, for example, silicon, polysilicon, germanium, SiGe, III-V semiconductors, etc., alone or in combination. According to some embodiments, the substrate 104 comprises an epitaxial layer, a silicon-on-insulator (SOI) structure, wafer, die formed from a wafer, etc.

According to some embodiments, the semiconductor arrangement 100 comprises a first semiconductor device 106 projecting from a surface 105 of the substrate 104. In some embodiments, the first semiconductor device 106 comprises a first nanowire 108 that extends between a first end 110 and a second end 112. According to some embodiments, the semiconductor arrangement 100 comprises a second semiconductor device 114 projecting from the surface 105 of the substrate 104. In some embodiments, the second semiconductor device 114 is adjacent the first semiconductor device 106. In some embodiments, the second semiconductor device 114 comprises a second nanowire 116 that extends between a first end 118 and a second end 120. According to some embodiments, the semiconductor arrangement 100 comprises a third semiconductor device 122 projecting from the surface 105 of the substrate 104. In some embodiments, the third semiconductor device 122 is adjacent the second semiconductor device 114. In some embodiments, the third semiconductor device 122 comprises a third nanowire 124 that extends between a first end 126 and a second end 128.

In some embodiments, the first semiconductor device 106 comprises a first type region 130. In some embodiments, the first type region 130 has a first conductivity type. In some embodiments, the first conductivity type of the first type region 130 comprises a p-type material, p+ type material, p++ type material, p-type dopants such as Boron, Gallium, Indium, etc., alone or in combination. In some embodiments, the first conductivity type of the first type region 130 comprises an n-type material, n+ type material, n++ type material, n-type dopants such as Phosphorous, Arsenic, Antimony, etc., alone or in combination. In some embodiments, the first type region 130 comprises a source region. In some embodiments, the first type region 130 comprises a drain region.

In some embodiments, the first type region 130 comprises a first portion 132 and a second portion 134. In some embodiments, the second portion 134 of the first type region 130 comprises some of the doped region 102. In some embodiments, the first portion 132 of the first type region 130 is formed at the first end 110 of the first nanowire 108. In some embodiments, the first portion 132 of the first type region 130 is formed by diffusion of dopants from the second portion 134 of the first type region 130 into the first end 110 of the first nanowire 108.

In some embodiments, the first semiconductor device 106 comprises a second type region 136 at the second end 112 of the first semiconductor device 106. According to some embodiments, the second type region 136 has a second conductivity type. In some embodiments, the second conductivity type of the second type region 136 comprises a p-type material, p+ type material, p++ type material, p-type dopants such as Boron, Gallium, Indium, etc., alone or in combination. In some embodiments, the second conductivity type of the second type region 136 comprises an n-type material, n+ type material, n++ type material, n-type dopants such as Phosphorous, Arsenic, Antimony, etc., alone or in combination. According to some embodiments, the second type region 136 comprises a source region. According to some embodiments, the second type region 136 comprises a drain region.

In some embodiments, a first channel region 138 is disposed between the first type region 130 and the second type region 136. In some embodiments, the first channel region 138 is formed, such as by doping some of the first nanowire 108. In some embodiments, the first channel region 138 is formed by a tilted or angled doping process, in which dopants are imparted to the first nanowire 108 at a non-vertical angle relative to the surface 105 of the substrate 104.

According to some embodiments, the first channel region 138 has a first channel conductivity type. In some embodiments, the first channel conductivity type of the first channel region 138 comprises a p-type material, p+ type material, p++ type material, p-type dopants such as Boron, Gallium, Indium, etc., alone or in combination. In some embodiments, the first channel conductivity type of the first channel region 138 comprises an n-type material, n+ type material, n++ type material, n-type dopants such as Phosphorous, Arsenic, Antimony, etc., alone or in combination.

In some embodiments, the second semiconductor device 114 comprises a third type region 140. In some embodiments, the third type region 140 has a third conductivity type. In some embodiments, the third conductivity type of the third type region 140 comprises a p-type material, p+ type material, p++ type material, p-type dopants such as Boron, Gallium, Indium, etc., alone or in combination. In some embodiments, the third conductivity type of the third type region 140 comprises an n-type material, n+ type material, n++ type material, n-type dopants such as Phosphorous, Arsenic, Antimony, etc., alone or in combination. In some embodiments, the third type region 140 comprises a source region. In some embodiments, the third type region 140 comprises a drain region.

In some embodiments, the third type region 140 comprises a first portion 142 and a second portion 144. In some embodiments, the second portion 144 of the third type region 140 comprises some of the doped region 102. In some embodiments, the first portion 142 of the third type region 140 is formed at the first end 118 of the second nanowire 116. In some embodiments, the first portion 142 of the third type region 140 is formed by diffusion of dopants from the second portion 144 of the third type region 140 into the first end 118 of the second nanowire 116.

In some embodiments, the second semiconductor device 114 comprises a fourth type region 146 at the second end 120 of the second semiconductor device 114. According to some embodiments, the fourth type region 146 has a fourth conductivity type. In some embodiments, the fourth conductivity type of the fourth type region 146 comprises a p-type material, p+ type material, p++ type material, p-type dopants such as Boron, Gallium, Indium, etc., alone or in combination. In some embodiments, the fourth conductivity type of the fourth type region 146 comprises an n-type material, n+ type material, n++ type material, n-type dopants such as Phosphorous, Arsenic, Antimony, etc., alone or in combination. According to some embodiments, the fourth type region 146 comprises a source region. According to some embodiments, the fourth type region 146 comprises a drain region.

In some embodiments, a second channel region 148 is disposed between the third type region 140 and the fourth type region 146. In some embodiments, the second channel region 148 is formed, such as by doping some of the second nanowire 116. In some embodiments, the second channel region 148 is formed by a tilted or angled doping process, in which dopants are imparted to the second nanowire 116 at a non-vertical angle relative to the surface 105 of the substrate 104.

According to some embodiments, the second channel region 148 has a second channel conductivity type. In some embodiments, the second channel conductivity type of the second channel region 148 comprises a p-type material, p+ type material, p++ type material, p-type dopants such as Boron, Gallium, Indium, etc., alone or in combination. In some embodiments, the second channel conductivity type of the second channel region 148 comprises an n-type material, n+ type material, n++ type material, n-type dopants such as Phosphorous, Arsenic, Antimony, etc., alone or in combination.

In some embodiments, the third semiconductor device 122 comprises a fifth type region 150. In some embodiments, the fifth type region 150 has a fifth conductivity type. In some embodiments, the fifth conductivity type of the fifth type region 150 comprises a p-type material, p+ type material, p++ type material, p-type dopants such as Boron, Gallium, Indium, etc., alone or in combination. In some embodiments, the fifth conductivity type of the fifth type region 150 comprises an n-type material, n+ type material, n++ type material, n-type dopants such as Phosphorous, Arsenic, Antimony, etc., alone or in combination. In some embodiments, the fifth type region 150 comprises a source region. In some embodiments, the fifth type region 150 comprises a drain region.

In some embodiments, the fifth type region 150 comprises a first portion 152 and a second portion 154. In some embodiments, the second portion 154 of the fifth type region 150 comprises some of the doped region 102. In some embodiments, the first portion 152 of the fifth type region 150 is formed at the first end 126 of the third nanowire 124. In some embodiments, the first portion 152 of the fifth type region 150 is formed by diffusion of dopants from the second portion 154 of the fifth type region 150 into the first end 126 of the third nanowire 124.

In some embodiments, the third semiconductor device 122 comprises a sixth type region 156 at the second end 128 of the third semiconductor device 122. According to some embodiments, the sixth type region 156 has a sixth conductivity type. In some embodiments, the sixth conductivity type of the sixth type region 156 comprises a p-type material, p+ type material, p++ type material, p-type dopants such as Boron, Gallium, Indium, etc., alone or in combination. In some embodiments, the sixth conductivity type of the sixth type region 156 comprises an n-type material, n+ type material, n++ type material, n-type dopants such as Phosphorous, Arsenic, Antimony, etc., alone or in combination. According to some embodiments, the sixth type region 156 comprises a source region. According to some embodiments, the sixth type region 156 comprises a drain region.

In some embodiments, a third channel region 158 is disposed between the fifth type region 150 and the sixth type region 156. In some embodiments, the second channel region 148 is formed, such as by doping some of the third nanowire 124. In some embodiments, the third channel region 158 is formed by a tilted or angled doping process, in which dopants are imparted to the third nanowire 124 at a non-vertical angle relative to the surface 105 of the substrate 104.

According to some embodiments, the third channel region 158 has a third channel conductivity type. In some embodiments, the third channel conductivity type of the third channel region 158 comprises a p-type material, p+ type material, p++ type material, p-type dopants such as Boron, Gallium, Indium, etc., alone or in combination. In some embodiments, the third channel conductivity type of the third channel region 158 comprises an n-type material, n+ type material, n++ type material, n-type dopants such as Phosphorous, Arsenic, Antimony, etc., alone or in combination.

Figure 2:
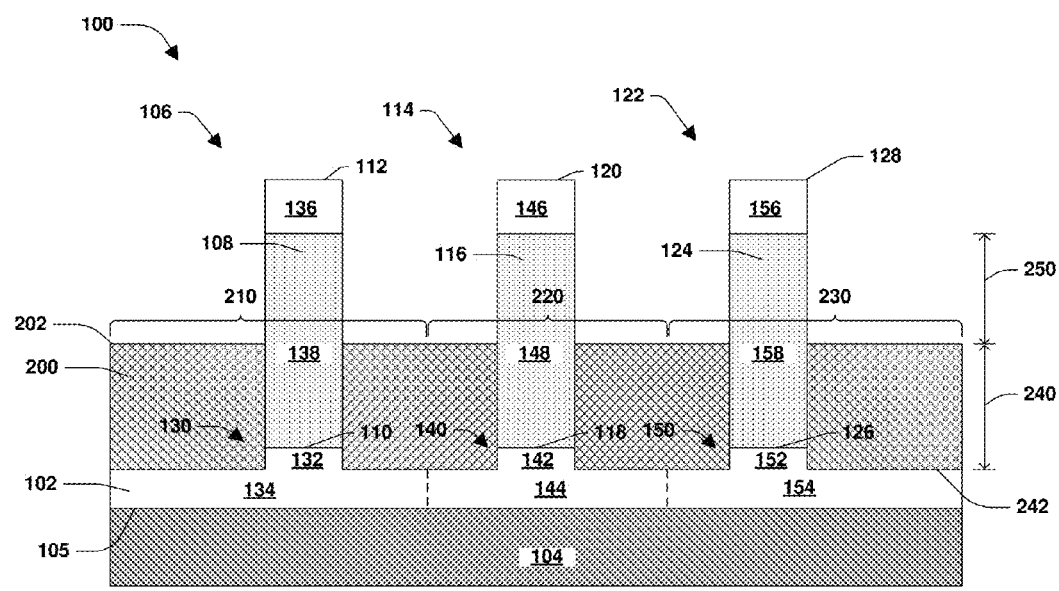
FIG. 2 illustrates forming a first insulator layer associated with forming a semiconductor arrangement, in accordance with some embodiments.

Turning now to FIG. 2, according to some embodiments, a first insulator layer 200 is formed over the second portion 134 of the first type region 130, the second portion 144 of the third type region 140, and the second portion 154 of the fifth type region 150. The first insulator layer 200 is formed in any number of ways, such as by thermal growth, chemical growth, atomic layer deposition (ALD), chemical vapor deposition (CVD), plasma-enhanced chemical vapor deposition (PECVD), spin-on deposition, etc. In an embodiment, the first insulator layer 200 is planarized using techniques such as CMP (chemical-mechanical polishing) and etched back to reduce the thickness of the first insulator layer 200. The first insulator layer 200 includes any number of materials, including oxides, silicon oxide, nitrides, silicon nitride, oxynitrides, $SiO_2$, etc., alone or in combination. In some embodiments, a top surface 202 of the first insulator layer 200 is substantially planar.

According to some embodiments, the first insulator layer 200 comprises a first insulator portion 210 around at least some of the first semiconductor device 106. In some embodiments, the first insulator portion 210 is around the first portion 132 of the first type region 130 and around at least some of the first channel region 138. According to some embodiments, the first insulator layer 200 comprises a second insulator portion 220 around at least some of the second semiconductor device 114. In some embodiments, the second insulator portion 220 is around the first portion 142 of the third type region 140 and around at least some of the second channel region 148. According to some embodiments, the first insulator layer 200 comprises a third insulator portion 230 around at least some of the third semiconductor device 122. In some embodiments, the third insulator portion 230 is around the first portion 152 of the fifth type region 150 and around at least some of the third channel region 158.

In some embodiments, the first insulator layer 200 has an insulator height 240 from a bottom surface 242 of the first insulator layer 200 to the top surface 202. According to some embodiments, the insulator height 240 is between about 5 nm to about 50 nm. In some embodiments, the top surface 202 of the first insulator layer 200 is separated a distance 250 from the second type region 136 of the first semiconductor device 106, the fourth type region 146 of the second semiconductor device 114, and the sixth type region 156 of the third semiconductor device 122. In some embodiments, the distance 250 is between about 5 nanometers (nm) to about 20 nm. In some embodiments, the distance 250 is about 15 nm.

Figure 3:
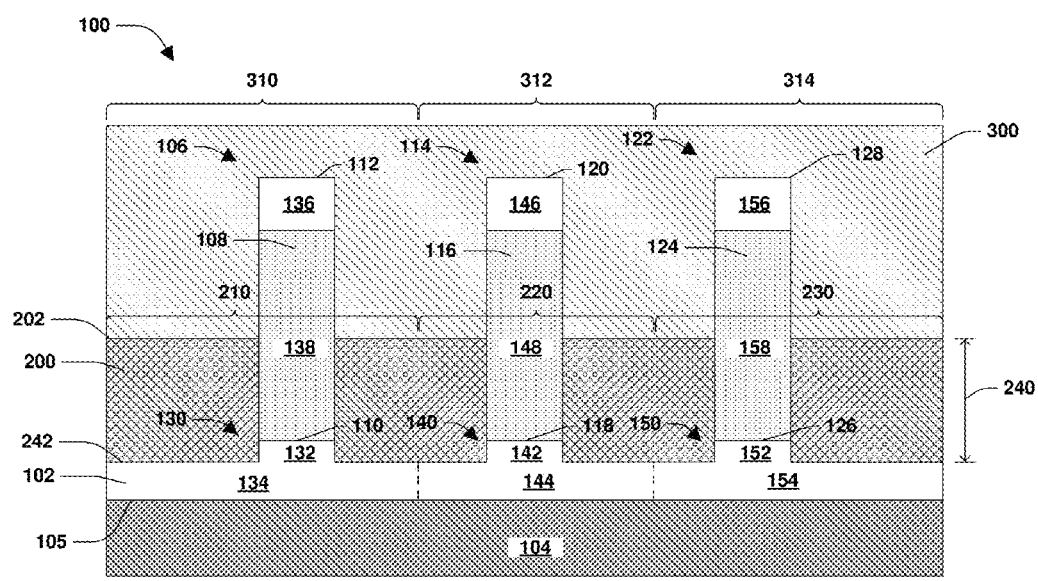
FIG. 3 illustrates forming a forming a mask associated with forming a semiconductor arrangement, in accordance with some embodiments.

Turning to FIG. 3, according to some embodiments, a mask 300 is formed over the first insulator layer 200, the first semiconductor device 106, the second semiconductor device 114, and the third semiconductor device 122. The mask 300 comprises any number of materials, such as, for example, oxides, silicon dioxide ($SiO_2$), etc. According to some embodiments, the mask 300 is formed by deposition, epitaxial growth, thermal growth, etc. In some embodiments, the mask 300 comprises a first mask portion 310, a second mask portion 312, and a third mask portion 314. In some embodiments, the first mask portion 310 is formed over the first insulator portion 210 and the first semiconductor device 106. In some embodiments, the second mask portion 312 is formed over the second insulator portion 220 and the second semiconductor device 114. In some embodiments, the third mask portion 314 is formed over the third insulator portion 230 and the third semiconductor device 122.

Figure 4:
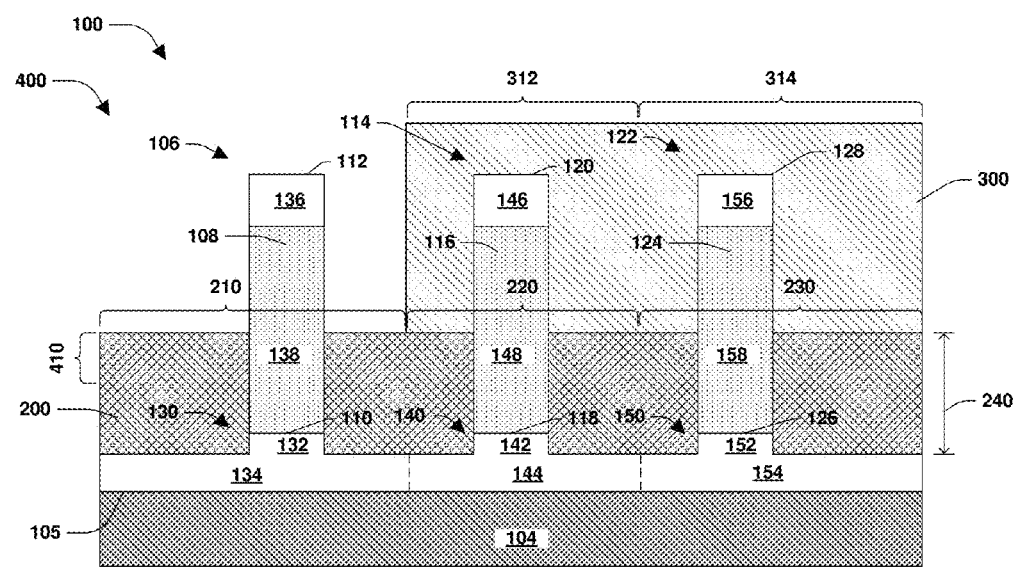
FIG. 4 illustrates patterning a mask associated with forming a semiconductor arrangement, in accordance with some embodiments.

Turning to FIG. 4, according to some embodiments, the mask 300 is patterned to form a first mask opening 400. In some embodiments, the first mask portion 310 is removed to form the first mask opening 400. According to some embodiments, the first semiconductor device 106 is exposed within the first mask opening 400. In some embodiments, the first mask portion 310 is removed such that the first insulator portion 210 of the first insulator layer 200 is exposed.

Figure 5:
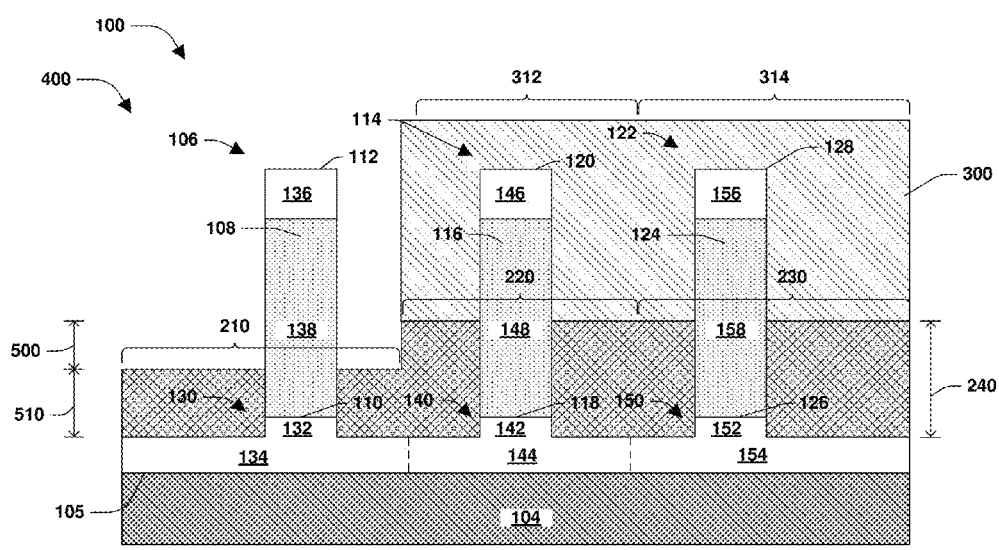
FIG. 5 illustrates patterning a first insulator layer associated with forming a semiconductor arrangement, in accordance with some embodiments.

Turning to FIG. 5, in some embodiments, a first height portion 410, illustrated in FIG. 4, of the first insulator portion 210 is removed, such as by etching. According to some embodiments, after the first height portion 410 is removed, a top surface of the first insulator portion 210 is substantially planar. In some embodiments, the first height portion 410 has a first height 500 of between about 0.1 nm to about 5 nm. In some embodiments, the first height 500 is about 2.5 nm. According to some embodiments, after the first height portion 410 is removed, the first insulator portion 210 has a first modified insulator height 510. In some embodiments, the first modified insulator height 510 is less than the insulator height 240.

Figure 6:
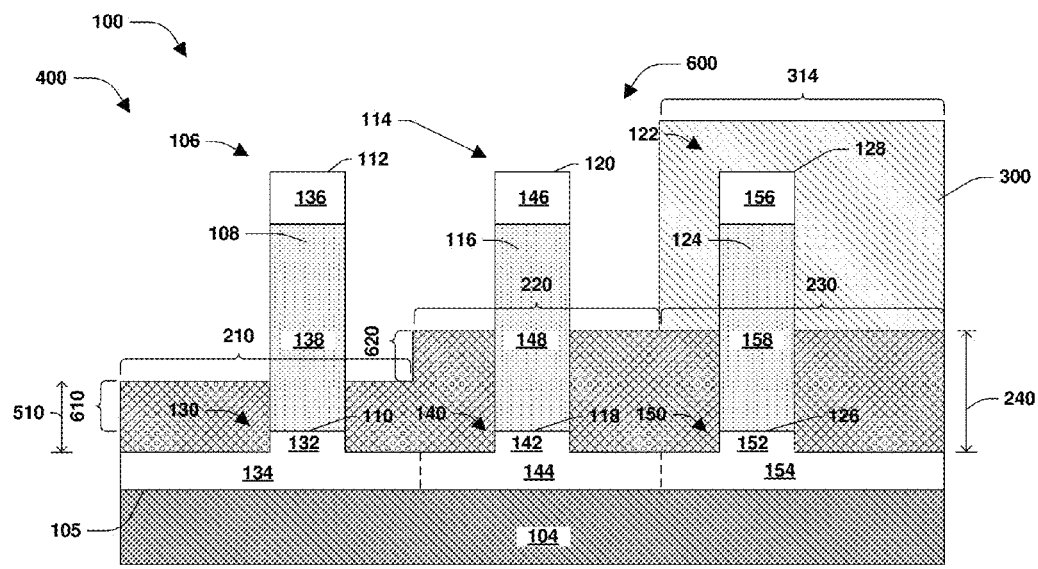
FIG. 6 illustrates patterning a mask associated with forming a semiconductor arrangement, in accordance with some embodiments.

Turning to FIG. 6, according to some embodiments, the mask 300 is patterned to form a second mask opening 600. In some embodiments, the second mask portion 312 is removed to form the second mask opening 600. According to some embodiments, the second semiconductor device 114 is exposed within the second mask opening 600. In some embodiments, the second mask portion 312 is removed such that the second insulator portion 220 of the first insulator layer 200 is exposed.

Figure 7:
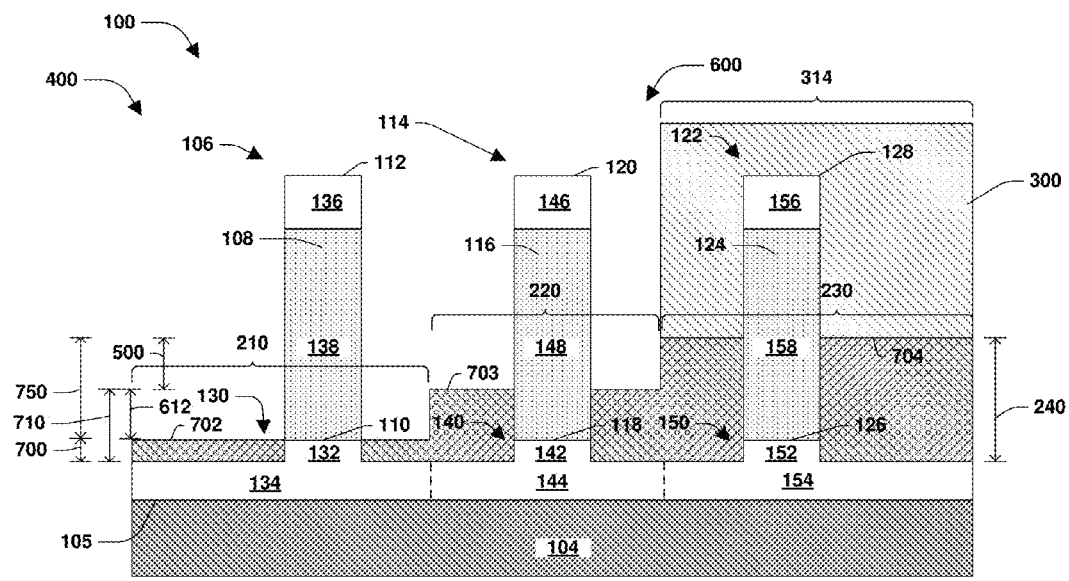
FIG. 7 illustrates patterning a first insulator layer associated with forming a semiconductor arrangement, in accordance with some embodiments.

Turning to FIG. 7, in some embodiments, a second height portion 610, illustrated in FIG. 6, of the first insulator portion 210 is removed, such as by etching. According to some embodiments, after the second height portion 610 is removed, a top surface 702 of the first insulator portion 210 is substantially planar. In some embodiments, the second height portion 610 has a second height 612 of between about 0.1 nm to about 5 nm. In some embodiments, the second height 612 is about 2.5 nm. According to some embodiments, after the second height portion 610 of the first insulator portion 210 is removed, the first insulator portion 210 has a first insulator height 700. According to some embodiments, the first insulator height 700 is between about 0.01 nm to about 5 nm. In some embodiments, the top surface 702 of the first insulator portion 210 is separated a distance 750 from a top surface 704 of the third insulator portion 230. According to some embodiments, the distance 750 is between about 1 nm to about 10 nm. In some embodiments, the distance 750 is about 5 nm.

In some embodiments, a third height portion 620, illustrated in FIG. 6, of the second insulator portion 220 is removed, such as by etching. According to some embodiments, after the third height portion 620 is removed, a top surface 703 of the second insulator portion 220 is substantially planar. In some embodiments, the third height portion 620 has the first height 500 of between about 0.1 nm to about 5 nm. In some embodiments, the first height 500 is about 2.5 nm. According to some embodiments, after the third height portion 620 of the second insulator portion 220 is removed, the second insulator portion 220 has a second insulator height 710. According to some embodiments, the second insulator height 710 is between about 2 nm to about 10 nm.

According to some embodiments, the first insulator height 700 is different than the second insulator height 710. In some embodiments, the second insulator height 710 is greater than the first insulator height 700. In some embodiments, the third insulator portion 230 has the insulator height 240. In some embodiments, the insulator height 240 is different than the second insulator height 710. In some embodiments, the insulator height 240 is greater than the second insulator height 710. In some embodiments, the insulator height 240 is different than the first insulator height 700. In some embodiments, the insulator height 240 is greater than the first insulator height 700.

Figure 8:
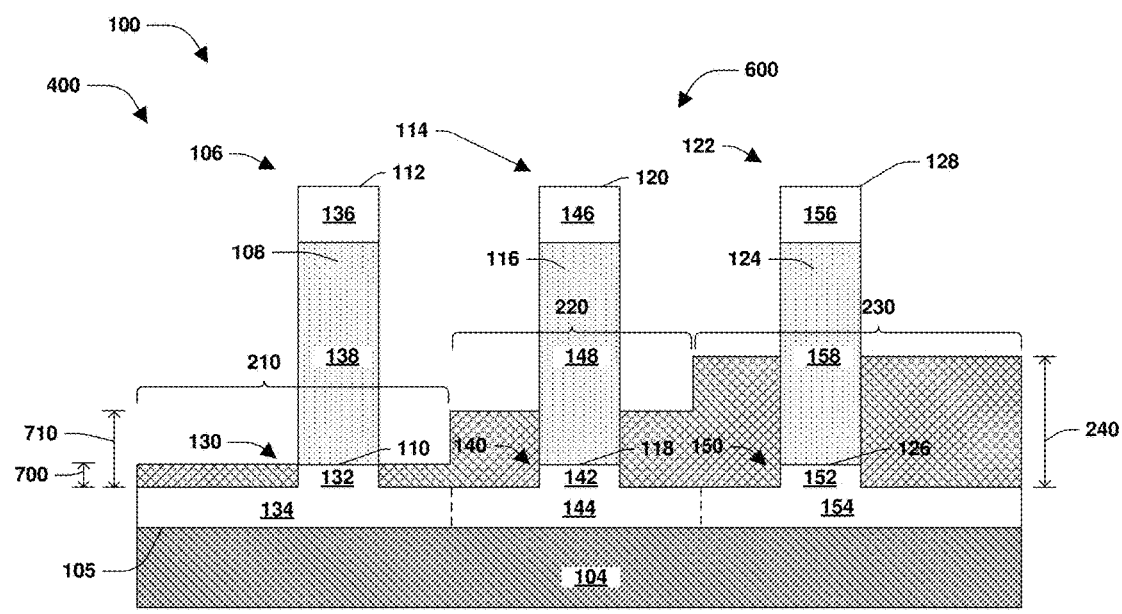
FIG. 8 illustrates a portion of a semiconductor arrangement, in accordance with some embodiments.

Turning to FIG. 8, according to some embodiments, the third mask portion 314 of the mask 300 is removed, such as by etching. According to some embodiments, the third semiconductor device 122 is exposed after removal of the third mask portion 314. In some embodiments, the third mask portion 314 is removed such that the third insulator portion 230 of the first insulator layer 200 is exposed.

Figure 9:
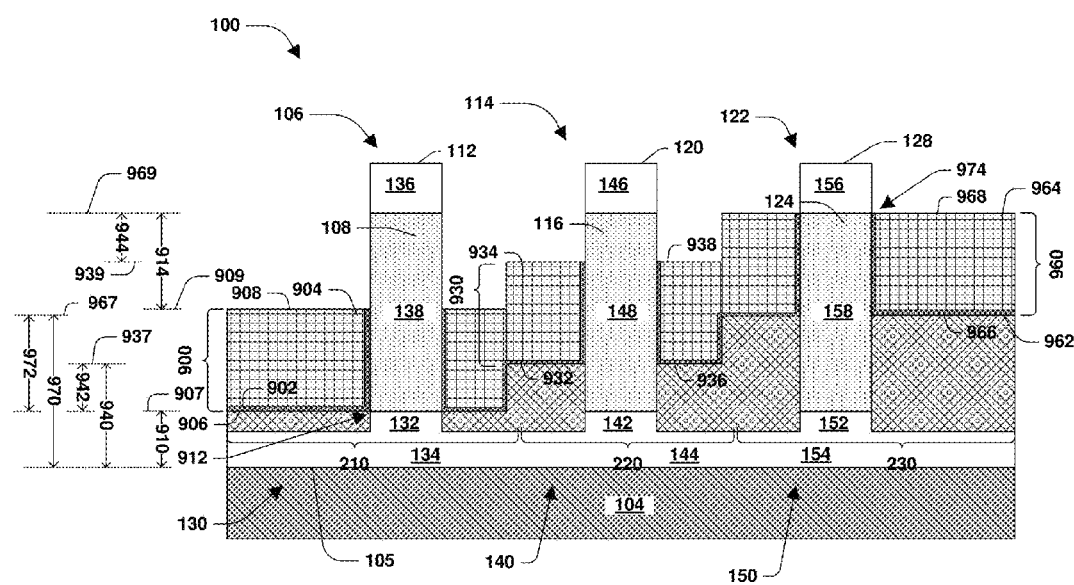
FIG. 9 illustrates forming a gate region associated with forming a semiconductor arrangement, in accordance with some embodiments.

Turning to FIG. 9, in some embodiments, a first gate region 900 is formed surrounding at least some of the first channel region 138. In some embodiments, the first gate region 900 comprises a first dielectric region 902. In some embodiments, the first dielectric region 902 is formed over the first insulator portion 210, and around at least some of the first channel region 138. In some embodiments, the first dielectric region 902 comprises a dielectric material with a relatively high dielectric constant. In some embodiments, the first dielectric region 902 comprises a standard dielectric material with a medium or low dielectric constant, such as $SiO_2$. The first dielectric region 902 is formed in any number of ways, such as by thermal growth, chemical growth, ALD, CVD, PECVD, etc.

According to some embodiments, the first gate region 900 comprises a first gate electrode 904. In some embodiments, the first gate electrode 904 is formed over the first dielectric region 902. In some embodiments, the first gate electrode 904 comprises a work function region. In some embodiments, the work function region comprises a p-type work function metal. In some embodiments, the work function region comprises a midgap work function metal. In some embodiments, the work function region is formed in any number of ways, such as by thermal growth, chemical growth, ALD, CVD, PECVD, etc.

In some embodiments, the first gate electrode 904 comprises a metal layer formed over the work function region, such that the work function region and the metal layer together comprise the first gate electrode 904. In some embodiments, the metal layer of the first gate electrode 904 is formed at least partially surrounding the first channel region 138. The metal layer of the first gate electrode 904 is formed in any number of ways, such as by thermal growth, chemical growth, ALD, CVD, PECVD, etc. In some embodiments, the metal layer of the first gate electrode 904 includes a conductive material, such as TiN, TaN, TaC, TaCN, tungsten, aluminum, copper, polysilicon, etc., alone or in combination.

In some embodiments, a first bottom surface 906 of the first gate region 900 lies within a first bottom plane 907 that is substantially parallel to the surface 105 of the substrate 104. In some embodiments, a first top surface 908 of the first gate region 900 lies within a first top plane 909 that is substantially parallel to the surface 105 of the substrate 104. In some embodiments, the first bottom surface 906 of the first gate region 900 is separated a first distance 910 from the surface 105 of the substrate 104.

According to some embodiments, the first bottom surface 906 of the first gate region 900 is separated a first gate distance 912 from the first type region 130. In some embodiments, the first gate distance 912 is substantially equal to zero. In some embodiments, the first top surface 908 of the first gate region 900 is separated a second gate distance 914 from the second type region 136. In some embodiments, the first gate distance 912 is different than the second gate distance 914. In some embodiments, the first gate distance 912 is less than the second gate distance 914. In some embodiments, the second gate distance 914 is less than the first gate distance 912, such as when the first gate region 900 is positioned closer to the second type region 136 than to the first type region 130.

In some embodiments, a second gate region 930 is formed surrounding at least some of the second channel region 148. In some embodiments, the second gate region 930 comprises a second dielectric region 932. In some embodiments, the second dielectric region 932 is formed over the second insulator portion 220, and around at least some of the second channel region 148. In some embodiments, the second dielectric region 932 comprises a dielectric material with a relatively high dielectric constant. In some embodiments, the second dielectric region 932 comprises a standard dielectric material with a medium or low dielectric constant, such as $SiO_2$. The second dielectric region 932 is formed in any number of ways, such as by thermal growth, chemical growth, ALD, CVD, PECVD, etc.

According to some embodiments, the second gate region 930 comprises a second gate electrode 934. In some embodiments, the second gate electrode 934 is formed over the second dielectric region 932. In some embodiments, the second gate electrode 934 comprises a work function region. In some embodiments, the work function region comprises a p-type work function metal. In some embodiments, the work function region comprises a midgap work function metal. In some embodiments, the work function region is formed in any number of ways, such as by thermal growth, chemical growth, ALD, CVD, PECVD, etc.

In some embodiments, the second gate electrode 934 comprises a metal layer formed over the work function region, such that the work function region and the metal layer together comprise the second gate electrode 934. In some embodiments, the metal layer of the second gate electrode 934 is formed at least partially surrounding the second channel region 148. The metal layer of the second gate electrode 934 is formed in any number of ways, such as by thermal growth, chemical growth, ALD, CVD, PECVD, etc. In some embodiments, metal layer of the second gate electrode 934 includes a conductive material, such as TiN, TaN, TaC, TaCN, tungsten, aluminum, copper, polysilicon, etc., alone or in combination.

In some embodiments, a second bottom surface 936 of the second gate region 930 lies within a second bottom plane 937 that is substantially parallel to the surface 105 of the substrate 104. In some embodiments, a second top surface 938 of the second gate region 930 lies within a second top plane 939 that is substantially parallel to the surface 105 of the substrate 104. In some embodiments, the second bottom surface 936 of the second gate region 930 is separated a second distance 940 from the surface 105 of the substrate 104.

According to some embodiments, the second distance 940 is different than the first distance 910. In some embodiments, the second bottom surface 936 is separated a third gate distance 942 from the third type region 140. According to some embodiments, the second top surface 938 of the second gate region 930 is separated a fourth gate distance 944 from the fourth type region 146. In some embodiments, the third gate distance 942 is substantially equal to the fourth gate distance 944, such that the second gate region 930 is spaced substantially equidistant between the third type region 140 and the fourth type region 146 of the second semiconductor device 114. In some embodiments, the third gate distance 942 is not equal to the fourth gate distance 944.

In some embodiments, a third gate region 960 is formed surrounding at least some of the third channel region 158. In some embodiments, the third gate region 960 comprises a third dielectric region 962. In some embodiments, the third dielectric region 962 is formed over the third insulator portion 230, and around at least some of the third channel region 158. In some embodiments, the third dielectric region 962 comprises a dielectric material with a relatively high dielectric constant. In some embodiments, the third dielectric region 962 comprises a standard dielectric material with a medium or low dielectric constant, such as $SiO_2$. The third dielectric region 962 is formed in any number of ways, such as by thermal growth, chemical growth, ALD, CVD, PECVD, etc.

According to some embodiments, the third gate region 960 comprises a third gate electrode 964. In some embodiments, the third gate electrode 964 is formed over the third dielectric region 962. In some embodiments, the third gate electrode 964 comprises a work function region. In some embodiments, the work function region comprises a p-type work function metal. In some embodiments, the work function region comprises a midgap work function metal. In some embodiments, the work function region is formed in any number of ways, such as by thermal growth, chemical growth, ALD, CVD, PECVD, etc.

In some embodiments, the third gate electrode 964 comprises a metal layer formed over the work function region, such that the work function region and the metal layer together comprise the third gate electrode 964. In some embodiments, the metal layer of the third gate electrode 964 is formed at least partially surrounding the third channel region 158. The metal layer of the third gate electrode 964 is formed in any number of ways, such as by thermal growth, chemical growth, ALD, CVD, PECVD, etc. In some embodiments, metal layer of the third gate electrode 964 includes a conductive material, such as TiN, TaN, TaC, TaCN, tungsten, aluminum, copper, polysilicon, etc., alone or in combination.

In some embodiments, a third bottom surface 966 of the third gate region 960 lies within a third bottom plane 967 that is substantially parallel to the surface 105 of the substrate 104. In some embodiments, a third top surface 968 of the third gate region 960 lies within a third top plane 969 that is substantially parallel to the surface 105 of the substrate 104. In some embodiments, the third bottom surface 966 of the third gate region 960 is separated a third distance 970 from the surface 105 of the substrate 104.

In some embodiments, the third distance 970 is different than the second distance 940. In some embodiments, the third distance 970 is greater than the second distance 940. According to some embodiments, the third bottom surface 966 of the third gate region 960 is separated a fifth gate distance 972 from the fifth type region 150. In some embodiments, the third top surface 968 of the third gate region 960 is separated a sixth gate distance 974 from the sixth type region 156. In some embodiments, the sixth gate distance 974 is substantially equal to zero. In some embodiments, the fifth gate distance 972 is different than the sixth gate distance 974. In some embodiments, the fifth gate distance 972 is greater than the sixth gate distance 974.

In some embodiments, the first semiconductor device 106 is regarded as comprising the first gate region 900. In some embodiments, the second semiconductor device 114 is regarded as comprising the second gate region 930. In some embodiments, the third semiconductor device 122 is regarded as comprising the third gate region 960.

Figure 10:
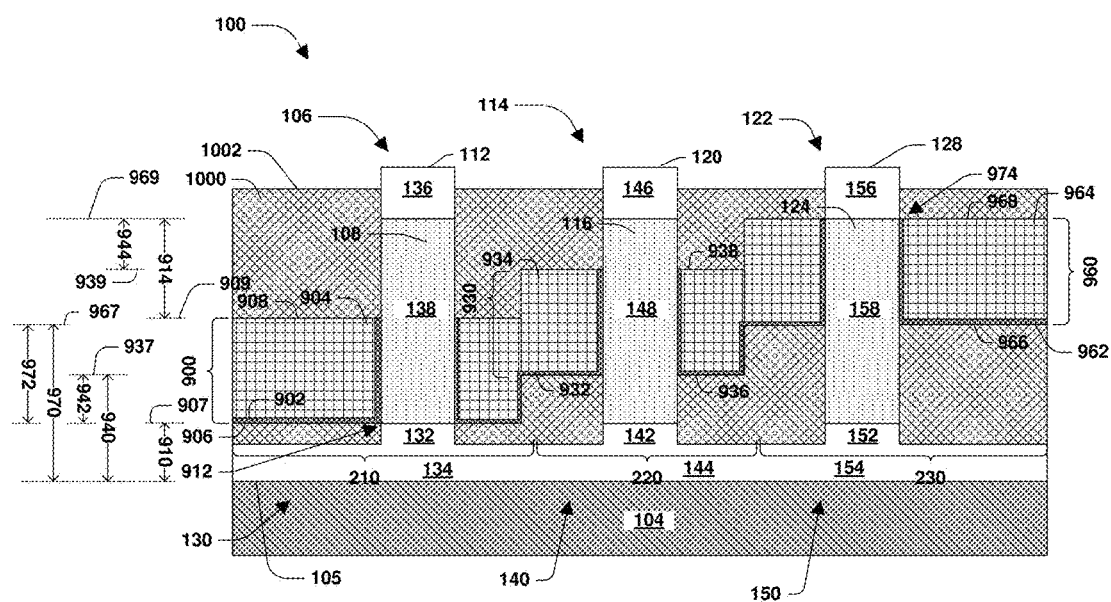
FIG. 10 illustrates forming a second insulator layer associated with forming a semiconductor arrangement, in accordance with some embodiments.

Turning to FIG. 10, according to some embodiments, a second insulator layer 1000 is formed over the first gate region 900, the second gate region 930, the third gate region 960, the first semiconductor device 106, the second semiconductor device 114, and the third semiconductor device 122. The second insulator layer 1000 is formed in any number of ways, such as by thermal growth, chemical growth, ALD, CVD, PECVD, etc. The second insulator layer 1000 includes any number of materials, including oxides, silicon oxide, nitrides, silicon nitride, oxynitrides, $SiO_2$, etc., alone or in combination. In some embodiments, a top surface 1002 of the second insulator layer 1000 is planarized, such as by a chemical mechanical polishing (CMP) process.

Figure 11:
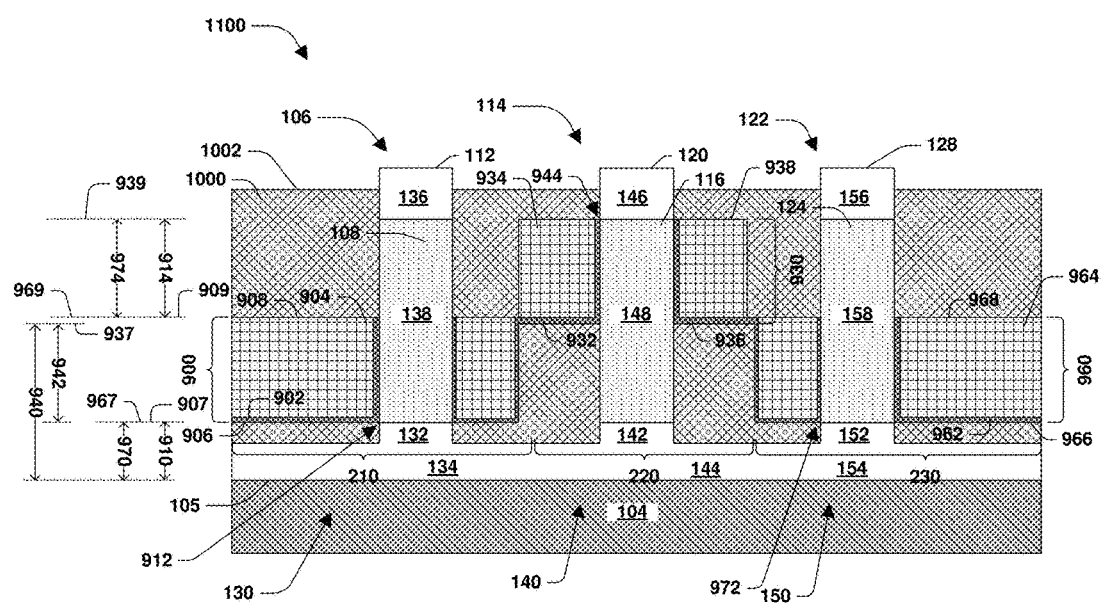
FIG. 11 illustrates a portion of a semiconductor arrangement, in accordance with some embodiments.

Turning to FIG. 11, according to some embodiments, a second example semiconductor arrangement 1100 is provided. In some embodiments, the second semiconductor arrangement 1100 comprises the first semiconductor device 106, the second semiconductor device 114, and the third semiconductor device 122. According to some embodiments, the second semiconductor arrangement 1100 is formed in a similar manner as described above with respect to the semiconductor arrangement 100.

In FIG. 11 the second gate region 930 is closer to the fourth type region 146 and farther from the third type region 140 as compared to FIG. 10, and the third gate region 960 is closer to the fifth type region 150 and farther from the sixth type region 156 as compared to FIG. 10. In some embodiments, the second distance 940, the third gate distance 942, and the sixth gate distance 974 are increased in FIG. 11 as compared to FIG. 10. In some embodiments, the fourth gate distance 944, the third distance 970, and the fifth gate distance 972 are decreased in FIG. 11 as compared to FIG. 10. In some embodiments, the first gate region 900 and the third gate region 960 are substantially coplanar, such that the third distance 970 is substantially equal to the first distance 910.

Figure 12:
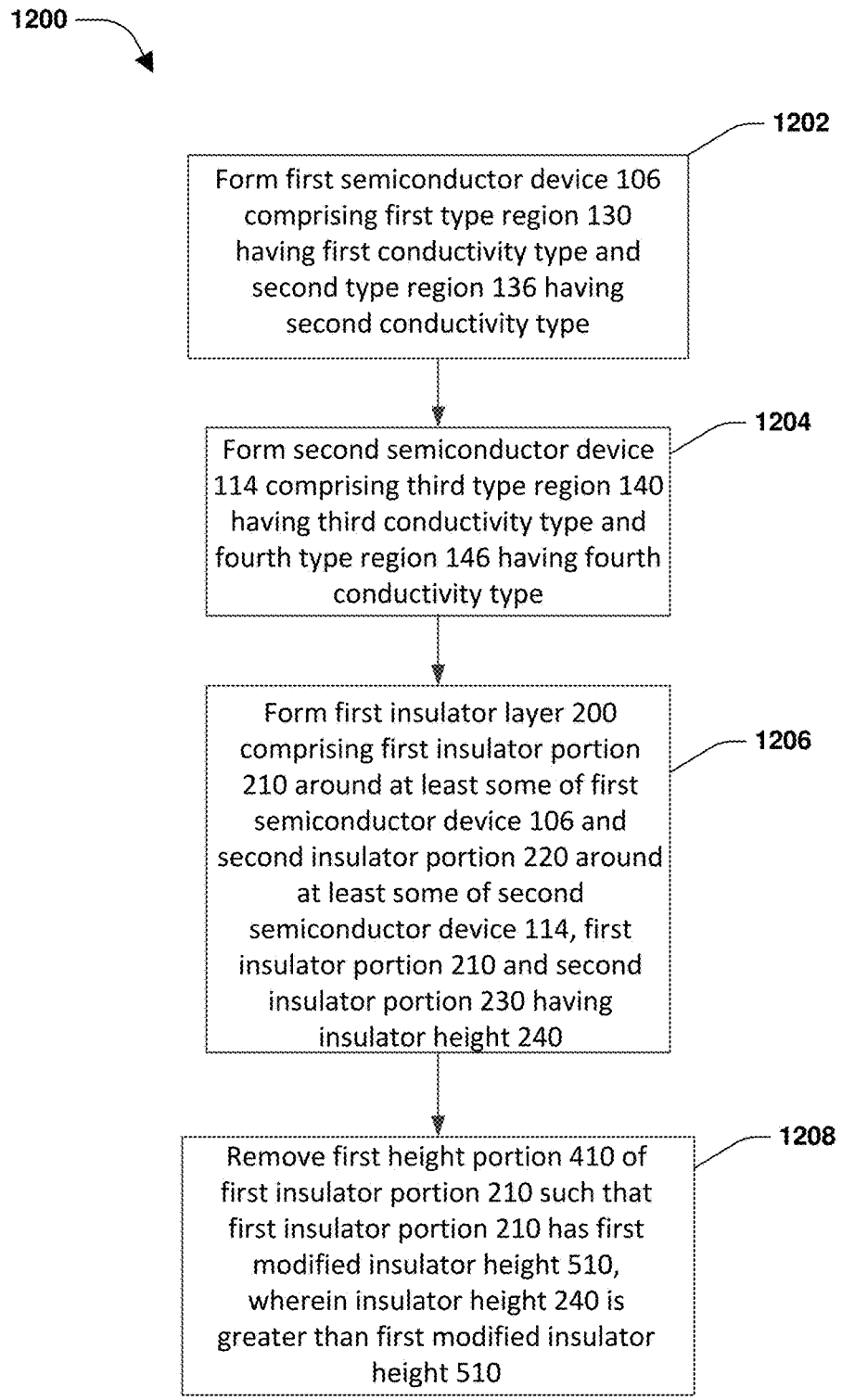
FIG. 12 illustrates a method of forming a semiconductor arrangement, in accordance with some embodiments.

An example method 1200 of forming a semiconductor arrangement, such as semiconductor arrangement 100, 1100 according to some embodiments, is illustrated in FIG. 12. At 1202, a first semiconductor device 106 is formed comprising a first type region 130 having a first conductivity type and a second type region 136 having a second conductivity type. At 1204, a second semiconductor device 114 is formed comprising a third type region 140 having a third conductivity type and a fourth type region 146 having a fourth conductivity type.

At 1206, a first insulator layer 200 is formed comprising a first insulator portion 210 around at least some of the first semiconductor device 106 and a second insulator portion 220 is formed around at least some of the second semiconductor device 114. In some embodiments, the first insulator portion 210 and the second insulator portion 220 have an insulator height 240. According to some embodiments, the first insulator layer 200 is formed before or after the semiconductor devices (e.g., the first semiconductor device 106, the second semiconductor device 114, the third semiconductor device 122) are formed. In some embodiments, the first insulator layer 200 is formed before the formation of one or more of the semiconductor devices, with one or more holes or openings formed, etched, etc. in the first insulator layer 200 and the one or more semiconductor devices (e.g., nanowires) grown in the one or more openings, such as using one or more seed layers. In some embodiments, the first insulator portion 210 is formed after at least one of the semiconductor devices are formed, such that the first insulator portion 210 is formed around at least one of the first semiconductor device 106, the second semiconductor device 114, or the third semiconductor device 122. At 1208, a first height portion 410 of the first insulator portion 210 is removed such that the first insulator portion 210 has a first modified insulator height 510. In some embodiments, the insulator height 240 is greater than the first modified insulator height 510.

According to some embodiments, at least one of the semiconductor arrangement 100 or the second semiconductor arrangement 1100 have semiconductor devices with varying degrees of symmetry, where symmetry corresponds to a distance from a gate region to a source or drain region relative to a distance from the gate region to the drain or source region. In some embodiments, at least one of the semiconductor arrangement 100 or the second semiconductor arrangement 1100 includes the first semiconductor device 106 with the first gate region 900 spaced substantially equidistant or not from the first type region 130 and the second type region 136. In some embodiments, at least one of the semiconductor arrangement 100 or the second semiconductor arrangement 1100 includes the second semiconductor device 114 with the second gate region 930 spaced substantially equidistant or not from the third type region 140 and the fourth type region 146. In some embodiments, at least one of the semiconductor arrangement 100 or the second semiconductor arrangement 1100 includes the third semiconductor device 122 with the third gate region 960 spaced substantially equidistant or not from the fifth type region 150 and the sixth type region 156.

According to some embodiments, the degree symmetry of a semiconductor device affects electrical performance of the device, such as current flow between the source and drain regions of the semiconductor device relative to voltage or bias applied to the gate region of the semiconductor device. According to some embodiments, where adjacent semiconductor devices, such as the first semiconductor device 106 and the second semiconductor device 114, have different degrees of symmetry such as illustrated in at least one of FIG. 10 or FIG. 11, a current ratio between the devices can be varied up to about 20%.

In some embodiments, a semiconductor arrangement comprises a first semiconductor device comprising a first type region having a first conductivity type and a second type region having a second conductivity type. In some embodiments, the first semiconductor device comprises a second semiconductor device adjacent the first semiconductor device. In some embodiments, the second semiconductor device comprises a third type region having a third conductivity type and a fourth type region having a fourth conductivity type. In some embodiments, the semiconductor arrangement comprises a first insulator layer comprising a first insulator portion around at least some of the first semiconductor device and a second insulator portion around at least some of the second semiconductor device. In some embodiments, the first insulator portion has a first insulator height, and the second insulator portion has a second insulator height. In some embodiments, the first insulator height is different than the second insulator height.

In some embodiments, a semiconductor arrangement comprises a first semiconductor device projecting from a surface of a substrate. In some embodiments, the first semiconductor device comprises a first type region having a first conductivity type, a second type region having a second conductivity type, a first channel region between the first type region and the second type region, and a first gate region surrounding at least some of the first channel region. In some embodiments, a first bottom surface of the first gate region is separated a first distance from the surface of the substrate. In some embodiments, the first bottom surface of the first gate region lies within a first bottom plane parallel to the surface of the substrate. In some embodiments, the semiconductor arrangement comprises a second semiconductor device adjacent the first semiconductor device and projecting from the surface of the substrate. In some embodiments, the second semiconductor device comprises a third type region having a third conductivity type, a fourth type region having a fourth conductivity type, a second channel region between the third type region and the fourth type region, and a second gate region surrounding at least some of the second channel region. In some embodiments, a second bottom surface of the second gate region is separated a second distance from the surface of the substrate. In some embodiments, the second bottom surface of the second gate region lies within a second bottom plane parallel to the surface of the substrate. In some embodiments, the second distance is different than the first distance.

In some embodiments, a method of forming a semiconductor arrangement comprises forming a first semiconductor device comprising a first type region having a first conductivity type and a second type region having a second conductivity type. In some embodiments, the method comprises forming a second semiconductor device comprising a third type region having a third conductivity type and a fourth type region having a fourth conductivity type. In some embodiments, the method comprises forming a first insulator layer comprising a first insulator portion around at least some of the first semiconductor device and a second insulator portion around at least some of the second semiconductor device, the first insulator portion and the second insulator portion having an insulator height. In some embodiments, the method comprises removing a first height portion of the first insulator portion such that the first insulator portion has a first modified insulator height, wherein the insulator height is greater than the first modified insulator height.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, regions, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor arrangement, the method comprising:
   forming a first nanowire and a second nanowire;
   forming a first insulator layer between the first nanowire and the second nanowire;
   etching a first portion of the first insulator layer adjacent the first nanowire to define a first insulator portion having a first insulator height, wherein a second portion of the first insulator layer defines a second insulator portion having a second insulator height different than the first insulator height, the first insulator portion and the second insulator portion both located between the first nanowire and the second nanowire;
   forming a dielectric layer over a top surface of the first insulator portion and the second insulator portion; and
   forming a gate electrode over the dielectric layer, wherein:
      a portion of a top surface of the gate electrode that overlies the first insulator portion is located at a first height relative to an underlying substrate upon which the first nanowire and the second nanowire are formed, a portion of the top surface of the gate electrode that overlies the second insulator portion is located at a second height relative to the underlying substrate, and the first height is different than the second height.

2. The method of claim 1, wherein the first insulator layer surrounds a sidewall of the first nanowire and a sidewall of the second nanowire.

3. The method of claim 1, comprising forming a mask over the first nanowire, the second nanowire, and the first insulator layer.

4. The method of claim 3, comprising patterning the mask to expose the first nanowire and the first portion of the first insulator layer, wherein the second portion of the first insulator layer and the second nanowire remain concealed by the mask after the patterning.

5. The method of claim 4, wherein the etching occurs while the second portion of the first insulator layer and the second nanowire are concealed by the mask and the first portion of the first insulator layer is exposed.

6. The method of claim 1, the etching comprising:
performing a first etch to etch the first portion of the first insulator layer while not etching the second portion of the first insulator layer; and
performing a second etch to concurrently etch the first portion of the first insulator layer and the second portion of the first insulator layer.

7. The method of claim 1, comprising forming a third nanowire, wherein:
the second nanowire is between the first nanowire and the third nanowire,
the forming a first insulator layer comprises forming the first insulator layer between the second nanowire and the third nanowire, and
the etching comprises:
performing a first etch to etch the first portion of the first insulator layer while not etching the second portion of the first insulator layer; and
performing a second etch to concurrently etch the first portion of the first insulator layer, the second portion of the first insulator layer, and a third portion of the first insulator layer adjacent the second nanowire and between the second nanowire and the third nanowire, wherein:
the second portion of the first insulator layer and the third portion of the first insulator layer together define the second insulator portion, and
a fourth portion of the first insulator layer between the second nanowire and the third nanowire defines a third insulator portion having a third insulator height different than the first insulator height and different than the second insulator height.

8. The method of claim 1, comprising forming a third nanowire, wherein:
the second nanowire is between the first nanowire and the third nanowire,
the forming a first insulator layer comprises forming the first insulator layer between the second nanowire and the third nanowire, and
the etching comprises:
performing a first etch to etch the first portion of the first insulator layer and a third portion of the first insulator layer adjacent the third nanowire and between the second nanowire and the third nanowire while not etching the second portion of the first insulator layer; and
performing a second etch to concurrently etch the first portion of the first insulator layer, the second portion of the first insulator layer, the third portion of the first insulator layer, and a fourth portion of the first insulator layer adjacent the second nanowire and between the second nanowire and the third nanowire, wherein:
the second portion of the first insulator layer and the fourth portion of the first insulator layer together define the second insulator portion, and
the third portion of the first insulator layer defines a third insulator portion having a third insulator height different than the second insulator height.

9. The method of claim 1, wherein the forming a dielectric layer comprises forming the dielectric layer along a sidewall of the first nanowire and a sidewall of the second nanowire.

10. The method of claim 9, wherein the dielectric layer is disposed between the sidewall of the first nanowire and the gate electrode and disposed between the sidewall of the second nanowire and the gate electrode.

11. The method of claim 1, comprising forming a second insulator layer over the gate electrode.

12. The method of claim 11, wherein the second insulator layer contacts the top surface of the gate electrode, a top surface of the dielectric layer, a sidewall of the first nanowire, and a sidewall of the second nanowire.

13. A method of forming a semiconductor arrangement, the method comprising:
forming a first nanowire and a second nanowire;
forming a first insulator layer between the first nanowire and the second nanowire;
performing a first etch, comprising:
etching a first portion of the first insulator layer adjacent the first nanowire while not etching a second portion of the first insulator layer adjacent the second nanowire;
forming a dielectric layer over a top surface of the first insulator layer after the etching; and
forming a gate electrode over the dielectric layer, wherein:
a portion of a top surface of the gate electrode that overlies the first portion of the first insulator layer is located at a first height relative to an underlying substrate upon which the first nanowire and the second nanowire are formed,
a portion of the top surface of the gate electrode that overlies the second portion of the first insulator layer is located at a second height relative to the underlying substrate, and
the first height is different than the second height.

14. The method of claim 13, comprising performing a second etch to concurrently etch the first portion of the first insulator layer and the second portion of the first insulator layer.

15. The method of claim 14, wherein the dielectric layer is formed after the performing a second etch.

16. The method of claim 13, wherein the performing a first etch defines a first insulator portion having a first insulator height and a second insulator portion having a second insulator height different than the first insulator height.

17. The method of claim 13, wherein the first insulator layer surrounds a sidewall of the first nanowire and a sidewall of the second nanowire.

18. The method of claim 13, wherein the forming a dielectric layer comprises forming the dielectric layer along a sidewall of the first nanowire and a sidewall of the second nanowire.

19. A method of forming a semiconductor arrangement, the method comprising:
- forming a first nanowire and a second nanowire;
- forming a first insulator layer between the first nanowire and the second nanowire;
- etching a first portion of the first insulator layer adjacent the first nanowire to define a first insulator portion having a first insulator height, wherein a second portion of the first insulator layer defines a second insulator portion having a second insulator height different than the first insulator height; and
- forming a gate electrode, wherein:
    - a portion of a top surface of the gate electrode that overlies the first insulator portion is located at a first height relative to an underlying substrate upon which the first nanowire and the second nanowire are formed,
    - a portion of the top surface of the gate electrode that overlies the second insulator portion is located at a second height relative to the underlying substrate, and
    - the first height is different than the second height.

20. The method of claim 19, comprising forming a second insulator layer over the gate electrode, wherein the second insulator layer contacts the top surface of the gate electrode, a sidewall of the first nanowire, and a sidewall of the second nanowire.

\* \* \* \* \*